United States Patent
Chumakov et al.

(10) Patent No.: US 9,070,639 B2
(45) Date of Patent: Jun. 30, 2015

(54) SHRINKAGE OF CRITICAL DIMENSIONS IN A SEMICONDUCTOR DEVICE BY SELECTIVE GROWTH OF A MASK MATERIAL

(75) Inventors: Dmytro Chumakov, Dresden (DE); Volker Grimm, Langebrück (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1109 days.

(21) Appl. No.: 13/069,488

(22) Filed: Mar. 23, 2011

(65) Prior Publication Data

US 2012/0244710 A1 Sep. 27, 2012

(51) Int. Cl.
H01L 21/311 (2006.01)
H01L 21/033 (2006.01)
H01L 21/768 (2006.01)

(52) U.S. Cl.
CPC ...... H01L 21/31144 (2013.01); H01L 21/0337 (2013.01); H01L 21/0338 (2013.01); H01L 21/76816 (2013.01)

(58) Field of Classification Search
CPC .......... H01L 21/76877; H01L 21/76879; H01L 21/0337; H01L 21/0338; H01L 21/3086; H01L 21/76831; H01L 21/76816; H01L 21/31144

USPC .......... 438/618, 622, 700, 701, 478
See application file for complete search history.

(56) References Cited

U.S. PATENT DOCUMENTS

| | | | | |
|---|---|---|---|---|
| 4,954,214 A | * | 9/1990 | Ho | 438/628 |
| 6,114,235 A | * | 9/2000 | Foote et al. | 438/636 |
| 6,916,733 B2 | * | 7/2005 | Lee | 438/618 |
| 7,078,299 B2 | * | 7/2006 | Maszara et al. | 438/285 |
| 2003/0064582 A1 | * | 4/2003 | Oladeji et al. | 438/638 |
| 2004/0150029 A1 | * | 8/2004 | Lee | 257/308 |
| 2005/0176257 A1 | * | 8/2005 | Uesawa | 438/700 |
| 2006/0154453 A1 | * | 7/2006 | Son et al. | 438/482 |
| 2007/0009840 A1 | * | 1/2007 | Kim et al. | 430/313 |

* cited by examiner

Primary Examiner — Colleen A Matthews
Assistant Examiner — Quovaunda V Jefferson
(74) Attorney, Agent, or Firm — Amerson Law Firm, PLLC

(57) ABSTRACT

In sophisticated semiconductor devices, manufacturing techniques and etch masks may be formed on the basis of a mask layer stack which comprises an additional mask layer, which may receive an opening on the basis of lithography techniques. Thereafter, the width of the mask opening may be reduced by applying a selective deposition or growth process, which thus results in a highly uniform and well-controllable adjustment of the target width of the etch mask prior to performing the actual patterning process, for instance for forming sophisticated contact openings, via openings and the like.

25 Claims, 9 Drawing Sheets

SHRINKAGE OF CRITICAL DIMENSIONS IN A SEMICONDUCTOR DEVICE BY SELECTIVE GROWTH OF A MASK MATERIAL

BACKGROUND OF THE INVENTION

1. Field of the Invention

The present disclosure generally relates to the field of semiconductor manufacturing, and, more particularly, to patterning techniques for forming device features having critical dimensions less than the resolution of optical lithography techniques.

2. Description of the Related Art

Semiconductor devices, such as advanced integrated circuits, typically contain a very large number of circuit elements, such as transistors, capacitors, resistors and the like, which are usually formed in a substantially planar configuration above an appropriate substrate having formed thereon a semiconductor layer. The fabrication of semiconductor devices, such as integrated circuits, requires tiny regions of precisely controlled size to be formed in one or more material layers provided above the substrate, such as a silicon substrate, a silicon-on-insulator (SOI) substrate, or other suitable carrier materials. These tiny regions of precisely controlled size are typically defined by patterning the material layer(s) by applying lithography, etch, implantation, deposition processes and the like, wherein, typically, at least in a certain stage of the patterning process, a mask layer is formed over the material layer(s) to be treated to define these tiny regions. Generally, a mask layer may consist of or may be formed by means of a layer of photoresist that is patterned by a lithographic process, typically a photolithography process. During the photolithography process, the resist is spin-coated onto the substrate surface and then selectively exposed to radiation, typically ultraviolet radiation, through a corresponding lithography mask, such as a reticle, thereby imaging the reticle pattern into the resist layer to form a latent image therein. After developing the photoresist, depending on the type of resist, positive resist or negative resist, the exposed portions or the non-exposed portions are removed to form the required pattern in the layer of photoresist. Based on this resist pattern, actual device patterns may be formed by further manufacturing processes, such as etch, implantation, anneal processes, and the like. Since the dimensions of the patterns in sophisticated integrated semiconductor devices are reduced with every new device generation, the equipment used for patterning device features have to meet very stringent requirements with regard to resolution and overlay accuracy of the involved fabrication processes. In this respect, resolution is considered as a measure for specifying the consistent ability to print minimum images of device features under conditions of predefined manufacturing variations. One important factor in improving the resolution is the lithographic process, in which patterns contained in the photo mask or reticle are optically transferred to the substrate via an optical imaging system. Therefore, great efforts are made to steadily improve optical properties of the lithographic system, such as numerical aperture, depth of focus and wavelength of the light source used.

The resolution of the optical patterning process may, therefore, significantly depend on the imaging capability of the equipment used, the photoresist materials for the specified exposure wavelength and the target critical dimensions of the device features to be formed in the device level under consideration. For example, gate electrodes of field effect transistors, which represent an important component of modern logic devices, may be 40 nm and even less for currently produced devices, with significantly reduced dimensions for device generations that are currently under development. Similarly, the line width of metal lines provided in the plurality of wiring levels or metallization layers may also have to be adapted to the reduced feature sizes in the device layer in order to account for the increased packing density. Consequently, the actual feature dimensions may be well below the wavelength of currently used light sources provided in current lithography systems. For example, currently in critical lithography steps, an exposure wavelength of 193 nm may be used, which, therefore, may require complex techniques for finally obtaining mask features having dimensions well below the exposure wavelength. Thus, highly non-linear processes are typically used to obtain dimensions below the optical resolution. For example, extremely non-linear photoresist materials may be used, in which a desired photochemical reaction may be initiated on the basis of a well-defined threshold so that weakly exposed areas may not substantially change at all, while areas having exceeded the threshold may exhibit a significant variation of their chemical stability with respect to a subsequent development process. The usage of highly non-linear imaging processes may significantly extend the capability for enhancing the resolution for available lithography tools and resist materials.

With the ongoing shrinkage of the critical dimensions of the circuit elements, however, the resolution of the patterning process based on sophisticated lithography techniques is substantially based on sophisticated etch techniques based on specifically designed mask layer stacks in combination with specific etch recipes. With reference to FIGS. 1a-1c, a typical sophisticated patterning regime may now be described with reference to forming contact openings so as to extend through an interlayer dielectric material and connect to a semiconductor region, such as a drain and source region of closely spaced transistor elements. It should be appreciated, however, that similar patterning strategies may generally be applied upon patterning any material layer during the fabrication of complex semiconductor devices.

FIG. 1a schematically illustrates a cross-sectional view of a semiconductor device 100 in an advanced manufacturing stage in which contact elements are to be formed so as to connect to critical device areas in a semiconductor material. As illustrated, the semiconductor device 100 comprises a substrate 101, above which is formed a semiconductor layer 102, such as a silicon layer, which in turn comprises a plurality of active regions, i.e., semiconductor regions, in and above which transistor elements are to be formed. For convenience, a single active region 102A is illustrated in FIG. 1a and represents a semiconductor region, above which a plurality of gate electrode structures 110 are formed. As discussed above, the gate electrode structures 110 may represent closely spaced circuit elements 110A, 110B, 110C which have critical dimensions of 50 nm and less so that a spacing between the gate electrode structures 110 may be the same order of magnitude. The gate electrode structures 110 have any appropriate configuration, for instance these structures may comprise a gate dielectric material 112 in combination with an electrode material 111. Furthermore, frequently, a spacer structure 113 is provided in the form of an oxide material, a nitride material and the like. Corresponding contact regions 102C may be formed in the active region 102A between the closely spaced gate electrode structures, at least some of which have to be contacted by corresponding contact elements 125A, 125B, indicated as dashed lines, which have to be formed during the further processing of the device 100 by patterning the dielectric material 121 of a contact level 120.

The semiconductor device 100 may be formed on the basis of any appropriate process strategy which may include sophisticated lithography techniques, etch processes, deposition techniques, anneal processes and planarization processes in order to form any isolation regions (not shown), which in turn laterally delineate the active region 102A. Thereafter, the gate electrode structures 110 are formed by depositing a gate layer stack in combination with hard mask materials and the like, wherein lithography techniques may be applied so as to provide a resist mask, which may then be further shrunk upon specific trim etch processes in order to obtain the desired lateral dimensions of the gate electrode structures. Thus, for providing appropriate mask features for covering the material layer stack and removing an exposed portion thereof, the finally obtained critical dimensions may critically depend on the trim etch processes in combination with the subsequent anisotropic etch strategies. Next, any further processes may be performed so as to form drain and source regions and the contact regions 102C, followed by the deposition of the dielectric material 121, which may represent a complex material system and the like, depending on the overall process and device requirements.

FIG. 1b schematically illustrates a cross-sectional view of the semiconductor device 100 in a further advanced manufacturing stage. As shown, a stack of mask layers 130 is formed above the dielectric material system 120 and comprises a resist layer 131, followed by an anti-reflective coating (ARC) layer 132 and a planarization layer 133. This layer system is patterned on the basis of sophisticated lithography techniques in which the resist material 131 is exposed on the basis of a lithography mask in order to form a latent image in the resist material 131, as is also discussed above. Hence, after development of the resist material 131, mask openings 131A define the lateral position of contact openings 121A to be formed in the material system 120, while, however, the lateral size of the openings 131A may be significantly greater compared to the desired target width of the openings 121A. Consequently, based on the openings 131A, the ARC layer 132 is typically patterned by using appropriate etch strategies, wherein, frequently, the process parameters of the etch process are selected such that corresponding openings 132A in the ARC material have a pronounced degree of tapering in order to further reduce the width. Consequently, the reduced width of the openings 132A at the bottom thereof may be used as an efficient etch mask for patterning the planarization layer 133 in order to form openings 133A therein, which may finally be used as an etch mask for etching into and through the material system 120. It turns out, however, that generally the width 133A may not substantially correspond to the desired target width of the openings 121A, thereby finally generating these openings with an increased width, which in turn may result in device failures or which may require an adapted device design in order to take into consideration the corresponding resolution capability of the patterning process for forming the openings 121A. For this reason, frequently, the etch parameters of the process for forming the contact openings 121A may also be adjusted so as to obtain a certain degree of tapering. It is well known, however, that plasma assisted anisotropic etch recipes rely on process parameters, such as plasma power, reactive components in the plasma atmosphere, polymer residues and the like, which may affect the finally achieved vertical and lateral etch rate. For example, upon increasing directionality and kinetic energy of ions that are present in the etch atmosphere, a pronounced reduction of the lateral etch rate may be achieved. Moreover, adding specific polymerizing gas components may also provide a mechanism for controlling the lateral etch rate since any such polymerizing gas components may result in a more or less pronounced generation of etch byproducts, which preferably accumulate at the sidewalls of the openings 121A. It is to be noted, however, that generally the degree of controllability of the lateral etch rate may also significantly depend on the material composition of the base material to be etched so that generally a very limited range for modulating the lateral dimensions of sophisticated openings, such as the contact openings 121A, is available during a corresponding etch process. For example, silicon dioxide, which is a well-established dielectric material for passivating critical circuit elements, such as the gate electrode structures 110, may allow only a very moderate degree of tapering during the plasma assisted etch process so that it is very difficult to achieve the desired reduced lateral dimensions.

FIG. 1c schematically illustrates the semiconductor device 100 in a further advanced manufacturing stage. As illustrated, the contact elements 125A, 125B comprise an appropriate conductive material 126 and thus electrically contact the contact regions 102C. However, as indicated by the dashed lines, the actual contact elements 125A, 125B may have significantly greater lateral dimensions, thereby possibly contributing to increased yield loss, for instance by forming leakage paths or short circuits in critical areas 114.

In other strategies, the capabilities of the patterning strategies may be enhanced by forming a liner material in the corresponding openings, such as the contact openings 121A (FIG. 1b) in order to appropriately adjust the lateral dimensions, which, however, may require sophisticated deposition and patterning strategies in a very advanced stage of the overall pattering process. Moreover, frequently, corresponding deposition processes and the subsequent patterning may be less than desirable in view of the finally obtained material characteristics, for instance if the patterning of sensitive low-k dielectric materials in metallization layers is considered.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure contemplates manufacturing techniques in which the efficiency of patterning strategies may be enhanced by appropriately adjusting the width of mask openings on the basis of a selective material deposition so that, at least within a mask opening, additional material may be added in a highly controllable manner, thereby reducing the width of a previously formed mask opening. To this end, a plurality of selective deposition processes or strategies may be applied, such as wet chemical deposition techniques, plasma assisted techniques, thermally activated vapor deposition techniques and the like, so that the etch mask itself may be appropriately adapted in lateral size on the basis of a highly controllable deposition process, thereby avoiding sophisticated deposition and etch processes after completing the actual patterning process.

One illustrative method disclosed herein relates to forming an etch mask above a semiconductor device. The method comprises forming an opening in a mask layer that is formed above a material layer to be patterned, wherein the opening extends through the mask layer. The method further comprises performing a selective deposition process by initiating selective growth of material on an exposed surface of the mask layer so as to reduce a width of the opening.

A further illustrative method disclosed herein comprises providing a material layer above a substrate of a semiconductor device. The method further comprises forming a mask layer stack above the material layer, wherein the mask layer stack comprises a first mask layer and a second mask layer that is formed above the first mask layer. Additionally, the method comprises forming a first mask opening in the first mask layer by using a second mask opening that is formed in the second mask layer. The method further comprises reducing a width of the first mask opening by performing a selective deposition process and using an exposed surface of the first mask layer to initiate the selective deposition process. Additionally, the method comprises patterning the material layer by using the first mask opening having the reduced width as an etch mask.

A further illustrative method disclosed herein comprises forming a mask layer above a material layer to be patterned, wherein the material layer is formed above a substrate of a semiconductor device. The method further comprises forming a resist mask above the mask layer, wherein the resist mask comprises a resist opening. The method further comprises forming a mask opening in the mask layer through the resist opening, wherein the mask opening exposes a sidewall surface of the mask layer. Furthermore, the method comprises growing a material selectively on the exposed sidewall surface in the mask opening to reduce a width thereof. Additionally, the method comprises patterning the material layer on the basis of the mask opening that has the reduced width.

BRIEF DESCRIPTION OF THE DRAWINGS

The disclosure may be understood by reference to the following description taken in conjunction with the accompanying drawings, in which like reference numerals identify like elements, and in which.

Figure 1A:
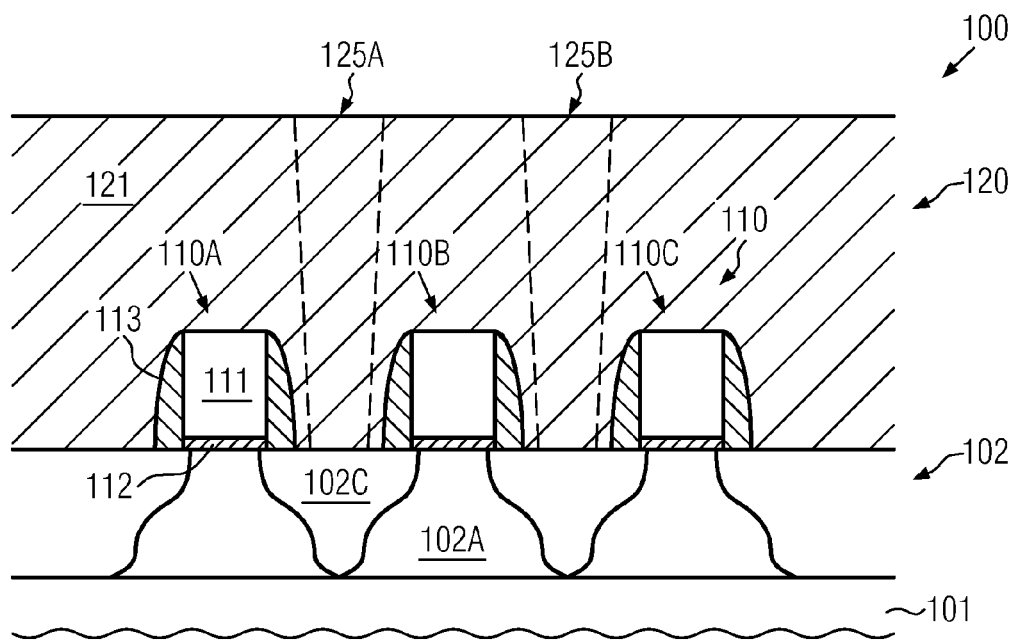
FIGS. 1a-1c schematically illustrate cross-sectional views of a semiconductor device during a patterning sequence for forming sophisticated contact elements, according to conventional patterning strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides manufacturing techniques in which patterning strategies may be extended in applicability by further reducing the critical dimensions of an etch mask prior to actually performing an etch process for etching into the material under consideration. To this end, at least one mask layer may be provided within a mask layer stack in which an opening formed therein, for instance on the basis of a resist material and the like, may be reduced in width by applying a selective material deposition or growth, at least at exposed sidewall surface areas of the mask layer under consideration. Consequently, by using one or more of such "mask shrinking layers," the critical dimensions of the etch mask may be appropriately adapted, possibly in combination with other process strategies, for instance by forming tapered mask openings in one or more additional mask layers of the etch mask, wherein the selective material deposition may provide a highly controllable process technique so that superior uniformity may be accomplished, for instance compared to sophisticated etch strategies in which the actual patterning process of the material under consideration may be performed on the basis of additional polymerizing components in order to form a polymer material in a non-selective manner on the exposed sidewall areas of an opening during the etch process. A selective growth process or deposition process may be readily applied for a plurality of materials, such as organic and inorganic materials, by applying process techniques, such as wet chemical processes, plasma assisted processes, evaporation processes, highly controllable self-limiting deposition techniques using a dedicated surface layer for initiating the deposition and the like. For example, highly controllable selective deposition techniques are established for forming silicon material, silicon/germanium material and the like, which may be efficiently incorporated into a mask layer stack so as to appropriately adjust the desired width of a mask opening formed therein. In other cases, wet chemical deposition techniques, for instance in the form of electroless plating and the like, may be applied for a wide class of materials, which may also exhibit a pronounced etch resistivity with respect to a plurality of plasma-based etch recipes. For example, a thin conductive material layer may be formed and patterned on the basis of a resist material, wherein the mask opening may then be adjusted on the basis of an electrochemical deposition process in a highly controllable manner. Thus, appropriate material may be selected, such as polymer materials and the like, which may provide sufficient etch resistivity during the patterning of a material layer of interest, or at least during the patterning of any optional lower-lying mask layers of the etch mask, while at the same time a pronounced selectivity with respect to a dedicated growth or deposition process may be accomplished, possibly in combination with a dedicated surface treatment in order to initiate a selective deposition process.

In some illustrative embodiments, the additional mask layer used for the selective deposition process may be formed directly below the resist mask, thereby contributing to a high degree of compatibility with conventional etch strategies, wherein, however, contrary to conventional approaches, the lower-lying mask layers of the layer stack may be provided with desired reduced critical dimensions, thereby extending the resolution capabilities of existing lithography and patterning strategies without requiring sophisticated deposition and etch processes, for instance when forming a liner material in a patterned material layer.

In other illustrative embodiments, the additional "mask shrinking layer" may be placed at any position within the layer stack, for instance as a final hard mask layer, depending on the overall etch resistivity, the selectivity of the various materials in the mask layer stack and the material system to be patterned and the like.

Consequently, on the basis of the enhanced patterning strategy for forming an etch mask, highly complex patterning processes, for instance for forming contact openings, via openings in a metallization system, trenches for sophisticated shallow trench isolations and the like, may be efficiently implemented on the basis of available lithography and patterning strategies. Furthermore, in some illustrative embodiments, appropriate mask features having reduced lateral dimensions may be provided, for instance for patterning gate electrode structures or other critical device features, which may be accomplished by a modified process sequence, in which the mask opening reduced in width by a selective growth process may be used for adjusting the lateral dimensions of a further mask material.

Figure 1B:
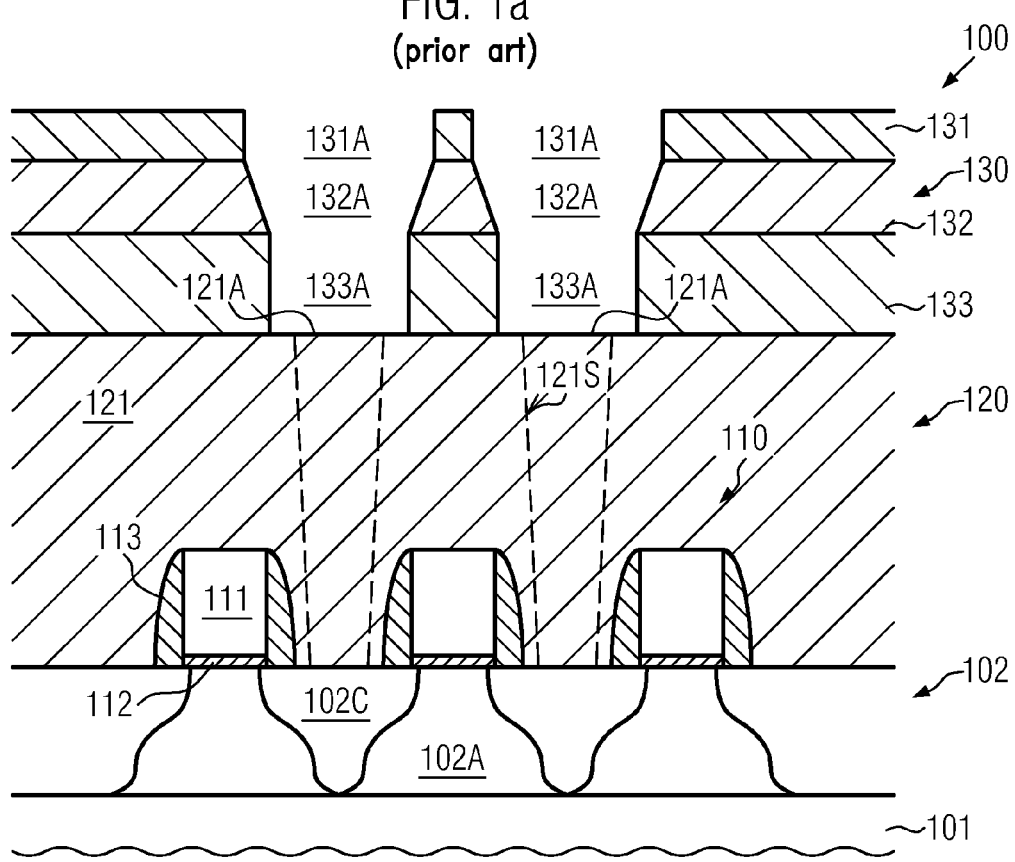
Figure 1C:
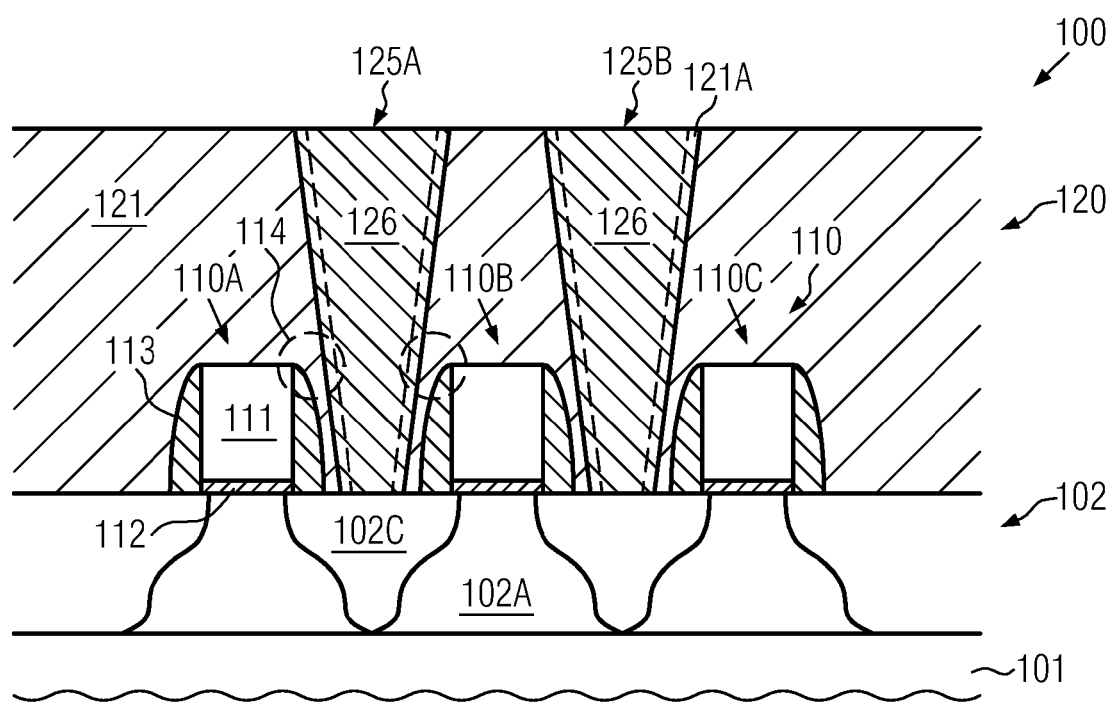

With reference to FIGS. 2a-2m, further illustrative embodiments will now be described in more detail, wherein reference may also be made to FIGS. 1a-1c, if appropriate.

Figure 2A:
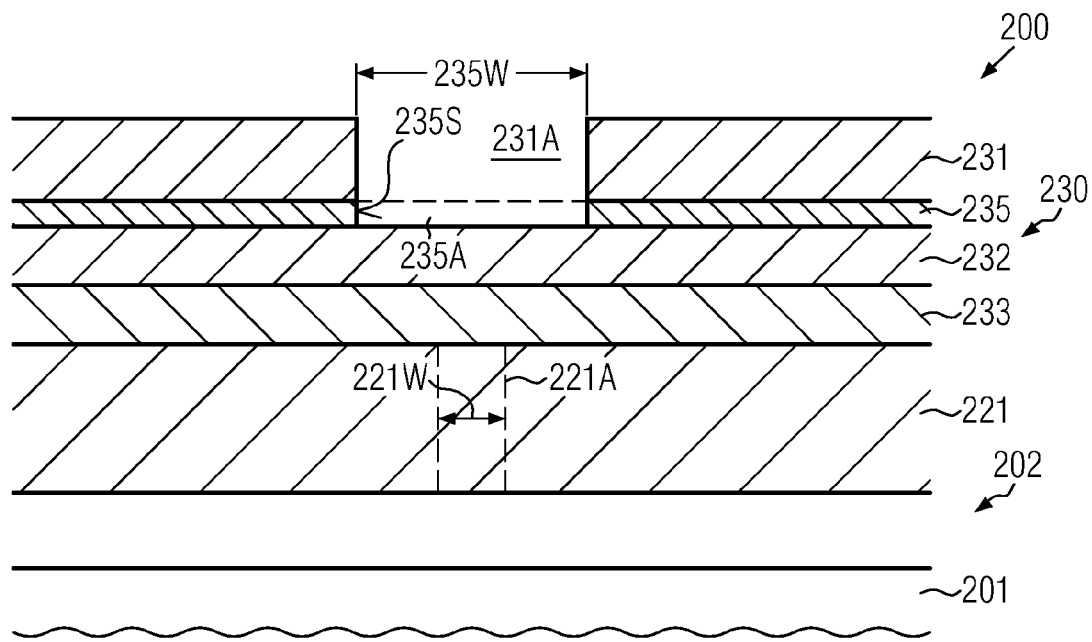
FIGS. 2a-2c schematically illustrate cross-sectional views of a semiconductor device during various manufacturing stages in providing an etch mask that includes at least one mask layer having an opening, the width of which may be reduced by performing a selective deposition process, according to illustrative embodiments.

FIG. 2a schematically illustrates a cross-sectional view of a semiconductor device 200 in a certain manufacturing stage in which a material layer 221 formed above the substrate 201 may have to be patterned so as to form an opening 221A therein, wherein a target width 221W is to be implemented. It should be appreciated that the target width 221W may represent a critical dimension, at least in one lateral direction, for instance the width of a critical trench, or the width 221W may represent critical dimensions in both lateral directions, for instance for a substantially square-like opening and the like. The material layer 221 may generally be comprised of any appropriate material or may represent the material system, for instance in the form of a semiconductor material, one or more dielectric materials and the like. For example, the layer 221 may be formed on or above the semiconductor layer 202 when the layer 221 may represent an interlayer dielectric material used to form the openings 221A in the form of contact openings, as is also discussed above. It should be appreciated, however, that in other cases the material layer 221 may be provided in a complex metallization layer, as will be described later on in more detail. In other cases, the layer 221 may represent a semiconductor material representing a portion of the semiconductor layer 202, while in other cases the layer 202 may be a buried insulating material if an SOI configuration is considered.

Moreover, the device 200 may comprise a mask layer stack 230 comprising, for instance, a resist layer 231 and one or more mask layers 232, 233, which may be provided in the form of an ARC material, a hard mask material or a planarization material, as is also described above with reference to the device 100. Moreover, the layer stack 230 may comprise an additional mask layer 235 which, in the embodiment shown, may be formed directly below the resist mask 231 and may be comprised of an appropriate material having a moderately high etch resistivity, at least with respect to an etch process for patterning the layers 232 and 233. To this end, a plurality of organic or inorganic materials are available, such as polymer materials, semiconductor materials, metal-containing materials, such as oxygen and/or nitrogen-containing materials, for instance in the form of titanium nitride, tantalum nitride and the like. In other cases, conventional dielectric materials, such as silicon dioxide, silicon nitride and the like, may be used, as long as the material may be selectively formed, at least on an exposed sidewall surface area 235S of the layer 235. That is, a mask opening 235A may be provided in the layer 235 which may have a similar size and configuration as an opening 231A of the resist mask 231.

The semiconductor device 200 as shown in FIG. 2a may be formed on the basis of any appropriate process strategy for providing the material layer 221, followed by deposition processes for forming the layers 233 and 232, which may be accomplished on the basis of well-established deposition recipes. Thereafter, the layer 235 may be formed, for instance, by spin-on techniques, chemical vapor deposition (CVD) and the like, depending on the material characteristics of the layer 235. Furthermore, a thickness of the layer 235 may be adapted with respect to the desired etch resistivity during the patterning of at least the mask layer stack 230. Thereafter, the resist material 231 may be formed and treated in accordance with well-established lithography techniques, followed by the exposure and development in order to form the opening 231A based on the lithography capabilities of the technique under consideration. Next, an etch process may be applied so as to etch through the layer 235 so as to expose the underlying mask layer 232. Consequently, after patterning the layer 235, the opening 235A may have a bottom that is formed by the layer 232, while the surface areas 235S are formed by the initial material of the layer 235, which may provide the desired selectivity upon performing a selective deposition process.

Figure 2B:
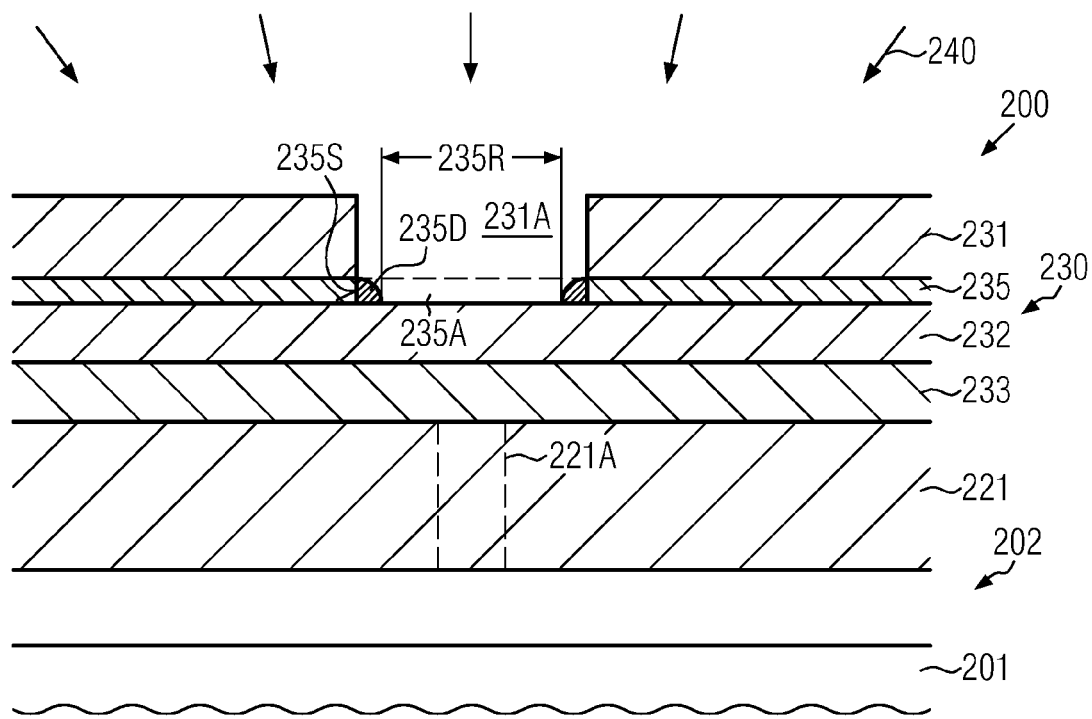

FIG. 2b schematically illustrates the device 200 in a further advanced manufacturing stage in which a selective deposition atmosphere 240 may be established, for instance on the basis of a wet chemical ambient, plasma assisted atmospheres, vapor-containing atmospheres and the like. Consequently, the surface 235S may act as an initialization surface which may thus represent a kind of "catalyst" material in order to deposit a specific material, which may be the same material as used in the layer 235 or which may be any other appropriate material that may selectively adhere to the surface area 235S. In this case, corresponding "spacers" 235D may be formed during the process 240 and may thus reduce the width of the opening 235A, as indicated by 235R. For example, the process 240 may be performed as a selective epitaxial growth process wherein process parameters are selected such that a significant material adhesion may be restricted to the surface 235S, while the deposition on other materials, such as the layer 231 and an exposed portion of the layer 232, may be sufficiently suppressed. In this regime, the process temperature of the process 240 may also be selected so as to be compatible with the device 200, for instance with respect to the thermal resistivity of the material 231, which may be accomplished by applying process recipes with temperatures of approximately 350° C. and less. In other illustrative embodiments, the process 240 may be performed on the basis of a wet chemical deposition process, for instance an electroplating process or an electroless plating process, which may require the provision of an appropriate surface 235S that may act as a catalyst material. For example, the layer 235 may per se be provided in the form of a conductive layer, wherein, if required, an appropriate surface treatment may be performed prior to the actual selective deposition in order to prepare the surface 235S for the subsequent wet chemical deposition process. In other cases, the surface 235S may per se act as an initialization surface layer so as to start the deposition of a material such as an alloy and the like. It should be appreciated that a plurality of wet chemical deposition recipes are available for binary alloys, ternary alloys, including cobalt, phosphorous, tungsten and the like. In other cases, a plurality of well-established barrier materials, which are used in sophisticated metallization systems in combination with copper, are formed on the basis of electrochemical deposition processes, while many of these materials may also exhibit pronounced etch resistivity with respect to a plurality of anisotropic etch recipes. In this case, any process temperatures may be kept well below critical temperatures, for instance for resist materials and the like, when any such materials in the layer stack 230 may exhibit a pronounced sensitivity for elevated temperatures. In other illustrative embodiments, the process 240 may be established on the basis of plasma ambient, thereby also providing superior flexibility in selecting appropriate materials for the layer 235, since a plurality of reactive components may be generated in a plasma ambient without requiring undue elevated temperatures. In other cases, the plasma ambient may be used to condition the surface 235S so as to enable a specific adhesion of molecules that may be provided in a separate step during the process 240, thereby achieving a high degree of selectivity. For example, dangling bonds may be created at the surface 235S in a significantly increased intensity compared to other exposed surface areas, which may subsequently be saturated by providing appropriate molecules, which may thus specifically adhere to the surface 235S and may thus act as an initialization material for forming the base elements 235D.

It should be appreciated that, generally, the process parameters may be controlled in a highly efficient manner, thereby also enabling efficient control of the growth rate and thus of the finally obtained reduced width 235R of the opening 235A.

Figure 2C:
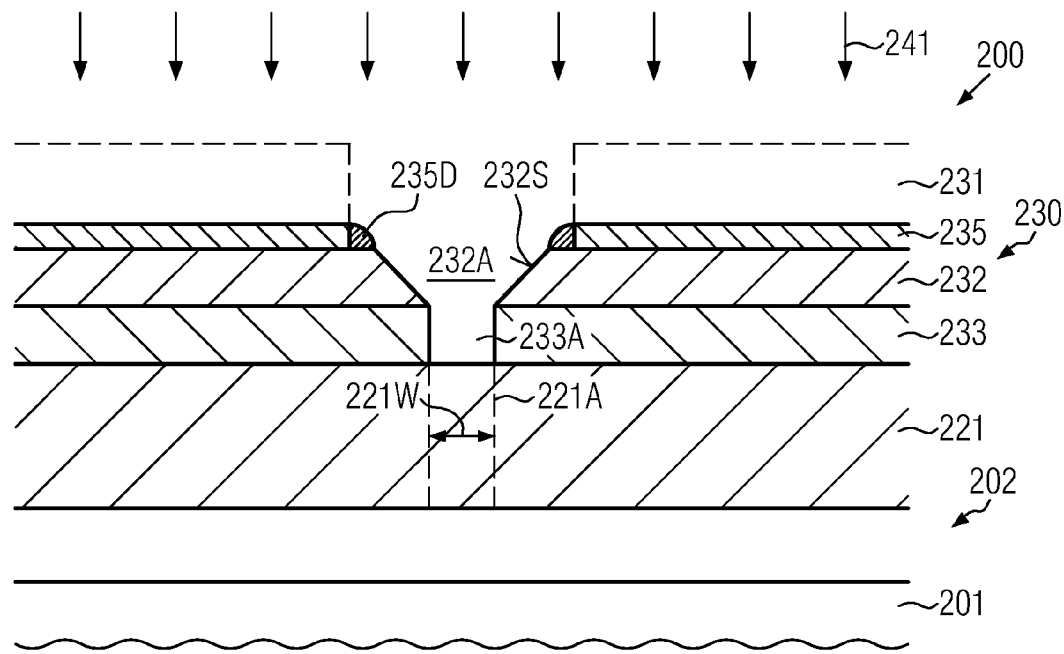

FIG. 2c schematically illustrates the device 200 in a further advanced manufacturing stage. As shown, an etch process or sequence 241 may be applied so as to pattern the one or more mask layers 232, 233, which may be accomplished on the basis of well-established etch strategies, for instance by forming the opening 232A in a highly tapered manner so as to further reduce the critical dimension, wherein, contrary to conventional approaches, the additional spacers 235D may allow obtaining a final width of an opening 233A which may substantially correspond to the desired target width 221W. It should be appreciated that, prior to or during the process or process sequence 241, the resist mask 231 may be removed or a portion thereof may be reserved, depending on the overall etch resistivity of the material 231. On the other hand, the spacers 235D may provide sufficient etch resistivity in order to enable a significant reduction or provide a desired high degree of tapering in the opening 232A.

On the basis of the layer stack 230 as patterned in accordance with the process 241 as shown in FIG. 2c, the processing may be continued by applying an appropriate etch strategy and etching through the material layer 221 in order to form the opening 221A therein.

Figure 2D:
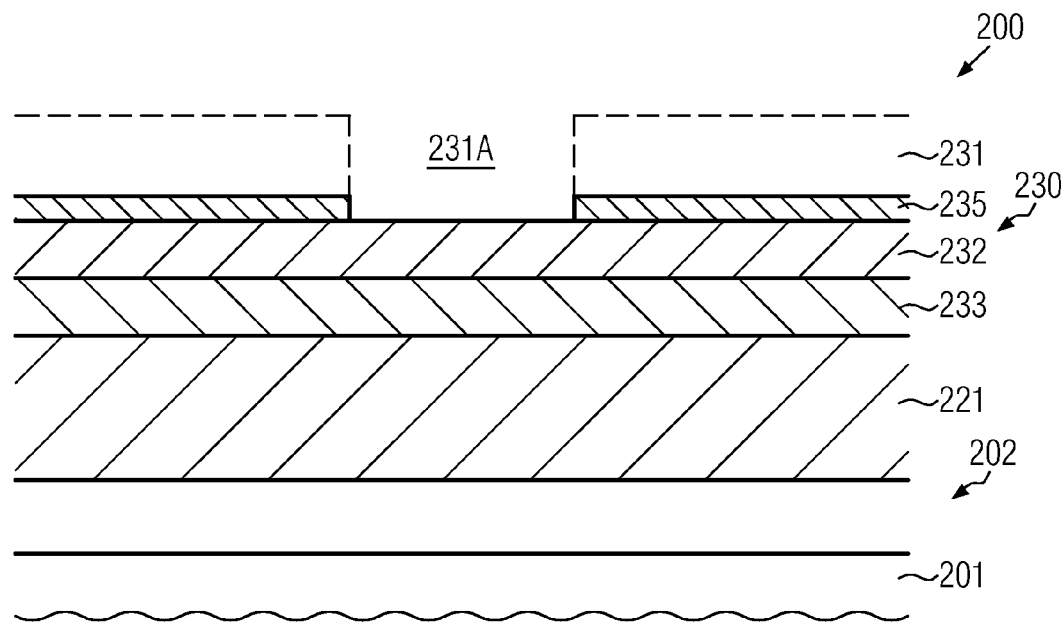
FIGS. 2d-2e schematically illustrate cross-sectional views of the semiconductor device according to further illustrative embodiments in which the selective deposition process may be performed as a non-masked process.

FIG. 2d schematically illustrates the device 200 according to further illustrative embodiments in which, after patterning the additional layer 235, the resist mask 231 may be removed. To this end, any well-established resist removal processes may be applied.

Figure 2E:
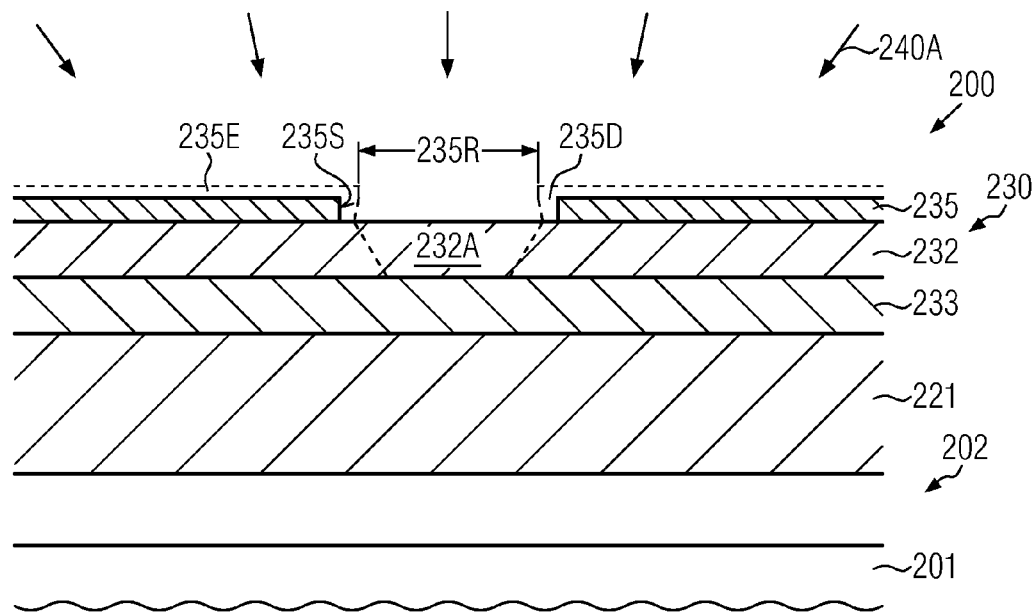

FIG. 2e schematically illustrates the device 200 during a selective deposition process 240A, which may be performed on the basis of any appropriate process strategy and process parameters, wherein, however, superior flexibility may be achieved, possibly with respect to elevated temperatures and the like, due to the removal of the resist mask 231 (FIG. 2d). For example, the process 240A may be performed as a selective epitaxial growth process, wherein, in addition to forming the spacers 235D, also an excess portion 235E may be formed on the initially deposited layer 235, thereby increasing the overall thickness thereof. A corresponding increase in thickness may be advantageous in terms of increasing the etch resistivity during the further processing. Consequently, the reduced width 235R may be obtained, wherein a certain degree of overhangs of the spacers 235D may result in a superior tapering of the opening 232A to be formed in the layer 232 in a subsequent etch process. It should be appreciated that the degree of overhangs formed in the spacers 235D may also depend on the degree of conformality of the deposition process 240A, which, in some illustrative embodiments, may be performed as a substantially highly conformal deposition process, while, in other cases, even self-limiting deposition recipes may be applied. In this case, a first layer may be deposited, possibly in a highly selective manner with respect to the exposed portion of the layer 232, and thereafter a second deposition atmosphere may be established with a second precursor species so as to form in combination with the previously deposited layer a desired layer of highly controllable thickness. Thereafter, the processing may be continued by patterning the layer 232, as is also described above, wherein, in particular, the increased thickness 235E may provide superior etch stop capabilities.

Figure 2F:
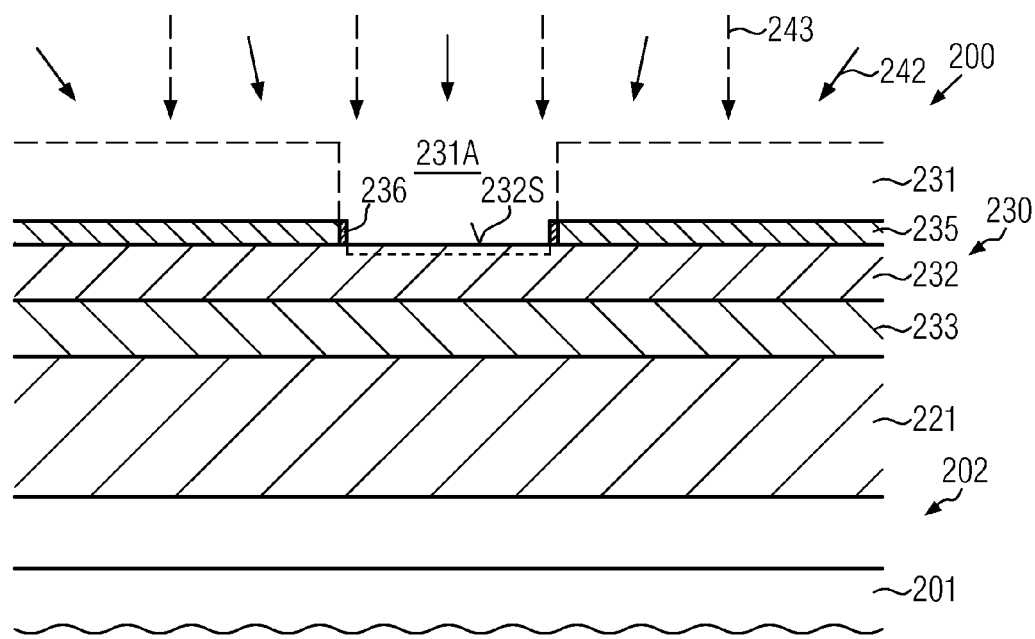
FIG. 2f schematically illustrates a cross-sectional view of the device during a process sequence in which a highly controllable deposition process, possibly in combination with intermediate etch processes, may be applied so as to appropriately adjust the width of the mask opening, according to illustrative embodiments.

FIG. 2f schematically illustrates the device 200 according to further illustrative embodiments in which a highly controllable deposition process or a surface treatment may be applied. For example, in some illustrative embodiments, an appropriate starting layer or a first cycle of a self-limiting deposition process may be applied, for instance after the removal of the resist mask 231, which may be removed if a selective deposition is difficult with respect to the material composition of the layer 235 on the basis of an etch process 243. In this manner, a surface layer 236 may be formed on the sidewalls of the layer 235, while any such material may be efficiently removed from the surface 232S of the layer 232. Consequently, during a subsequent deposition cycle, material may preferably be deposited on the material 236 while a significant material deposition on other surface areas may be suppressed. If required, one or more of such deposition and etch cycles may be repeated in order to increase the thickness of the layer 236 in a highly controllable manner, thereby providing superior overall process uniformity. In other cases, the process 242 may be applied so as to form the layer 236 as a catalyst material, which may then initiate a subsequent selective deposition. It should be appreciated that a layer thickness may be extremely thin or wherein even a continuous coverage of exposed surface areas may not be required, thereby also enabling an efficient removal from the surface 232S without unduly affecting the surface characteristics of the layer 232. For example, a corresponding catalyst material may be provided with a thickness of 5 nm and significantly less on the basis of sputter deposition techniques, chemical vapor deposition, wet chemical processes and the like. Consequently, after forming spacers selectively on the surface 236, the further processing may be continued by patterning the layer 232, as is already discussed above.

Figure 2G:
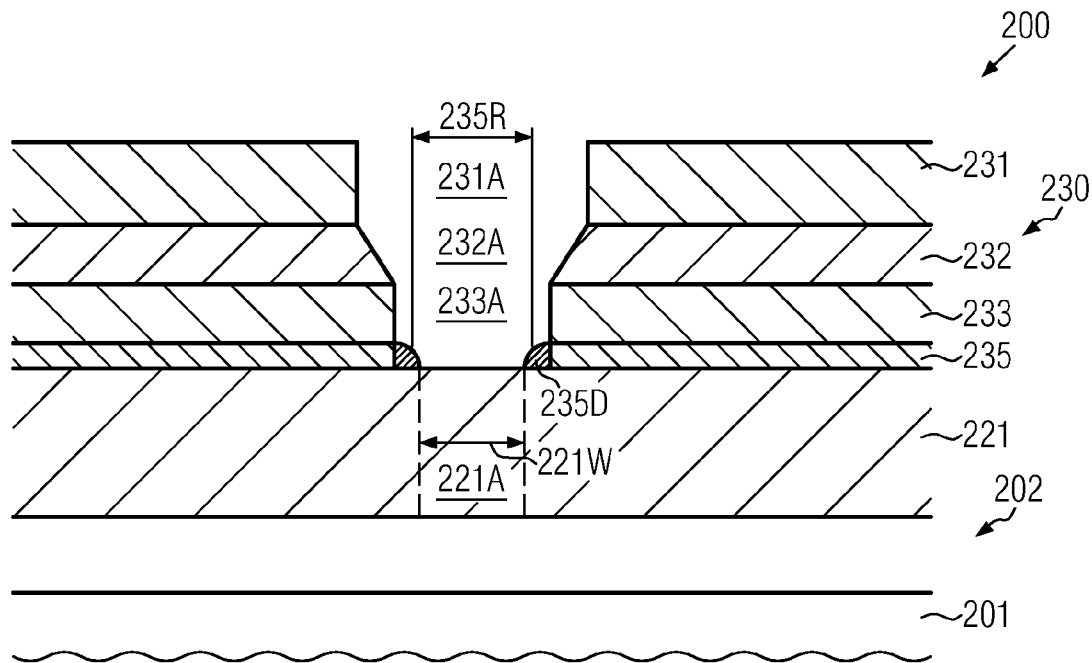
FIG. 2g schematically illustrates a cross-sectional view of the semiconductor device according to illustrative embodiments in which at least one mask layer may be positioned at the bottom or near the bottom of a mask layer stack when reducing the width of a mask opening on the basis of a selective deposition process.

FIG. 2g schematically illustrates the device 200 according to further illustrative embodiments wherein the layer 235, which may be used for a selective deposition process, may be incorporated at any other appropriate position within the layer stack 230. In the embodiment shown, the layer 235 may be formed on the material layer 221 to be patterned and may be provided on the basis of a material having a high etch resistivity with respect to the subsequent anisotropic etch process for forming the opening 221A. For example, the plurality of conductive barrier materials, such as titanium nitride, are well known as having a high etch resistivity and may thus be used as efficient hard mask materials. In this case, the openings 231A, 232A and 233A may be patterned in accordance with process strategies, as previously described with reference to the device 100, wherein, after etching through the layer 235, a selective deposition process may be applied, such as an electrochemical deposition process, in order to form the spacers 235D in a highly controllable manner, thereby obtaining the desired reduced width 235R, which may thus substantially correspond to the target width 221W.

Figure 2H:
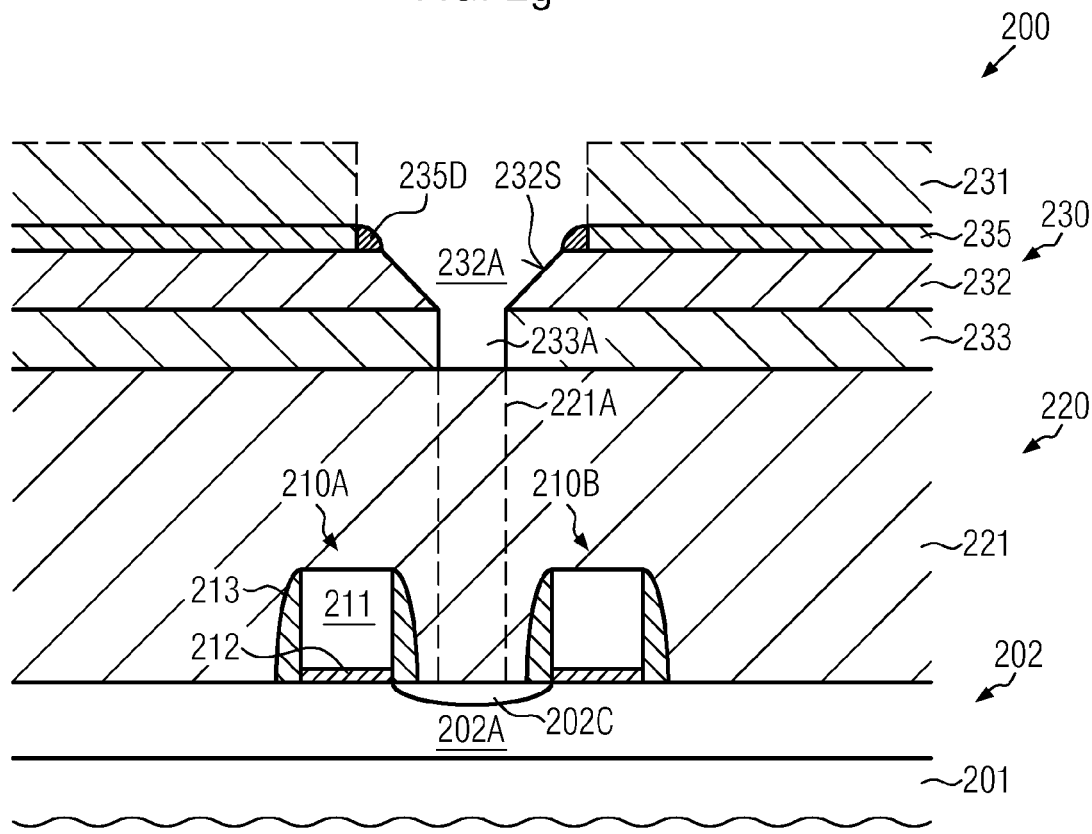
FIGS. 2h-2i schematically illustrate cross-sectional views of the semiconductor device in which the patterning strategy based on a selective material deposition may be applied to the formation of contact openings and via openings, respectively, according to illustrative embodiments.

FIG. 2h schematically illustrates the device 200 in a further illustrative advanced manufacturing stage according to illustrative embodiments in which the layer 221 to be patterned may represent a portion of a contact level 220 of the device 200. As shown, a plurality of circuit elements, such as gate electrode structures 210A, 210B, may be formed above the semiconductor layer 202 and may have any appropriate configuration, as, for instance, also described above with reference to the device 100. For example, the gate electrode structures 210A, 210B may comprise an electrode material 211, a gate dielectric material 212 and a spacer structure 213. In sophisticated applications, the opening 221A may have to extend between the closely spaced gate electrode structures 210A, 210B and may thus require a target width that may be comparable or even less than a length of the gate electrode structures 210A, 210B, which may be 50 nm and less. In this situation, the mask layer stack 230 may be patterned on the basis of process techniques as described above, thereby providing an etch mask, which may also be indicated as 230, having at least the mask opening 233A that substantially corresponds to the desired width of the opening 221A. In this case, the further processing may be continued by applying well-established anisotropic etch recipes and etching through the material 221 so as to connect to a contact region 202C formed in an active region 202A of the semiconductor layer 202.

Figure 2I:
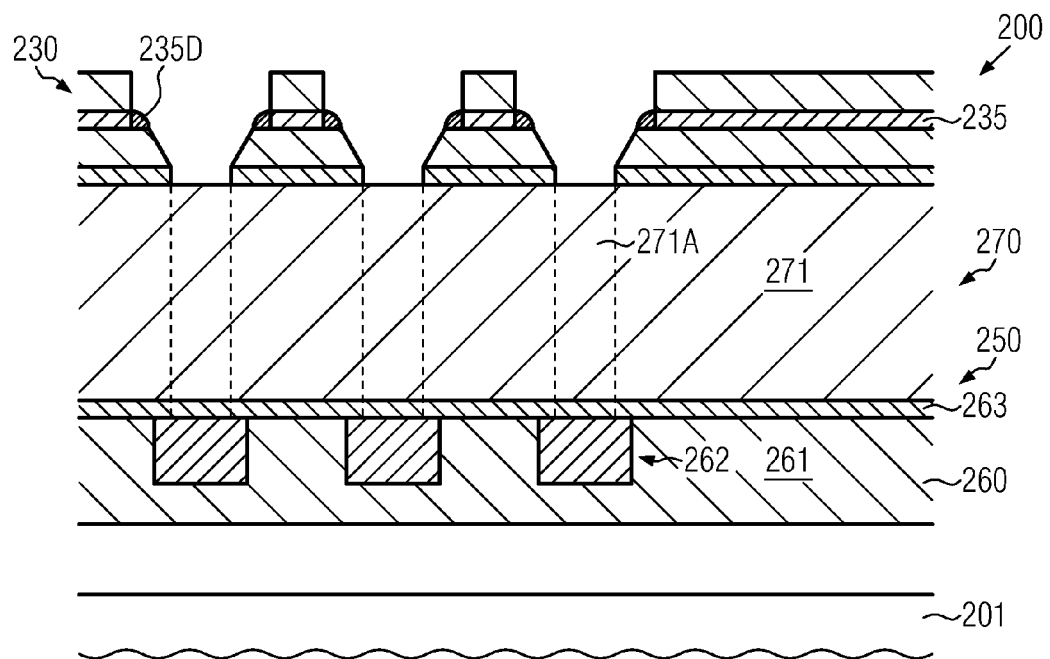

FIG. 2i schematically illustrates the device 200 according to further illustrative embodiments in which the mask layer stack or etch mask 230 may be provided above the dielectric material 271 of a metallization layer 270. The metallization layer 270 may be a part of a metallization system 250 of the device 200 and may comprise further metallization layers 260, depending on the overall process complexity. Also in this case, closely spaced contact openings 271A may have to be formed in the dielectric material 271, wherein a target width of these openings may be significantly less compared to optical lithography capabilities. Also in this case, the layer 235 comprising the spacers 235D formed on the basis of a selective deposition process may be used so as to appropriately pattern the layer stack 230. Consequently, the metallization system 250 may be formed on the basis of well-established process strategies, however, without requiring redesign or sophisticated additional process strategies for reducing the width of the critical contact openings 271A. Thus, these openings 271A may connect to closely spaced metal regions 262 formed in the dielectric material 261 of the metallization layer 260. By avoiding additional patterning processes upon forming the openings 271A in the material 271, undue etch damage may be avoided, which may result in a significantly reduced performance of the metallization system 250, in particular when low-k dielectric materials or even ultra low-k (ULK) materials may be formed in at least some of the metallization layers 270, 260.

It should be appreciated that the mask layer stack 230 as shown in FIGS. 2h and 2i may be formed on the basis of any of the process strategies as described above with reference to FIGS. 2a-2f. In particular, a configuration of the layer stack 230 as shown in FIG. 2f may be applied upon patterning the metallization layer 270, since here, typically, conductive hard mask materials may be used upon patterning sophisticated low-k dielectric materials.

Figure 2J:
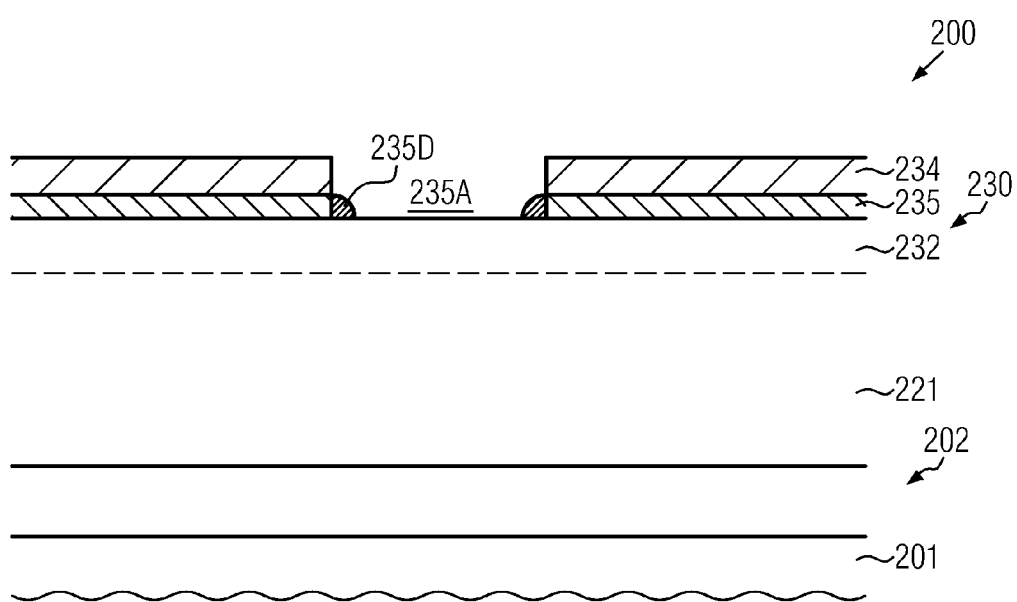
FIGS. 2j-2m schematically illustrate cross-sectional views of the semiconductor device during various manufacturing stages in forming a mask feature on the basis of the patterning strategy as described above in order to provide the mask feature with reduced lateral dimensions in order to pattern a material or material system, such as a gate electrode structure, according to still further illustrative embodiments.

FIG. 2j schematically illustrates the device 200 according to further illustrative embodiments. As shown, the layer 221 may represent a layer or material system which may have to be patterned so as to provide a circuit feature, such as a gate electrode structure and the like. As shown, the layer stack 230 may be provided so as to comprise the layer 235 in combination with a further mask layer 234, which may differ in material composition from the layer 235 so as to enable a selective growth of the spacer elements 235D, as is also described above. For example, the layer 234 may be provided in the form of conventional dielectric materials, such as silicon dioxide, silicon nitride and the like, while the layer 235 may be provided in the form of a semiconductor material, possibly in combination with a thin etch stop liner (not shown), such as a silicon nitride material and the like. In other cases, the layer 221 may comprise an additional hard mask material 232, for instance in the form of silicon nitride and the like. The layers of the stack 230 may be formed on the basis of any appropriate deposition technique. Thereafter, the layers 234, 235 may be patterned by using sophisticated lithography techniques on the basis of a resist material, as is also described above. Next, a selective deposition process may be applied, for instance a selective epitaxial growth process, in order to form the spacers 235D so as to obtain the opening 235A with the desired target dimensions.

In other illustrative embodiments (not shown), the layer 234 may be omitted and a substantial conformal selective growth may be initiated also on a top surface of the layer 235, thereby increasing the thickness thereof and at the same time forming the spacer element 235D, as, for instance, described with reference to FIG. 2e.

Figure 2K:
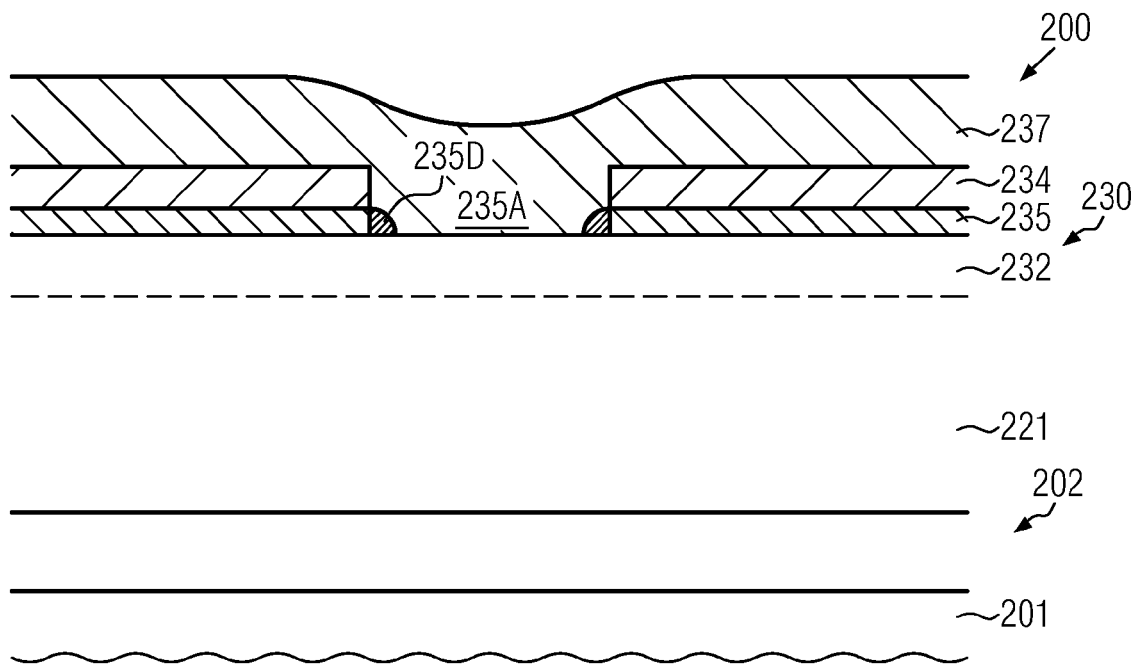

FIG. 2k schematically illustrates the device 200 in a further advanced manufacturing stage. As shown, a mask material 237, such as silicon dioxide, silicon nitride, amorphous carbon and the like, may be deposited on the basis of appropriate deposition techniques, such as spin-on techniques, CVD and the like. Consequently, the mask material 237 may receive the opening 235A having the desired target width.

Figure 2L:
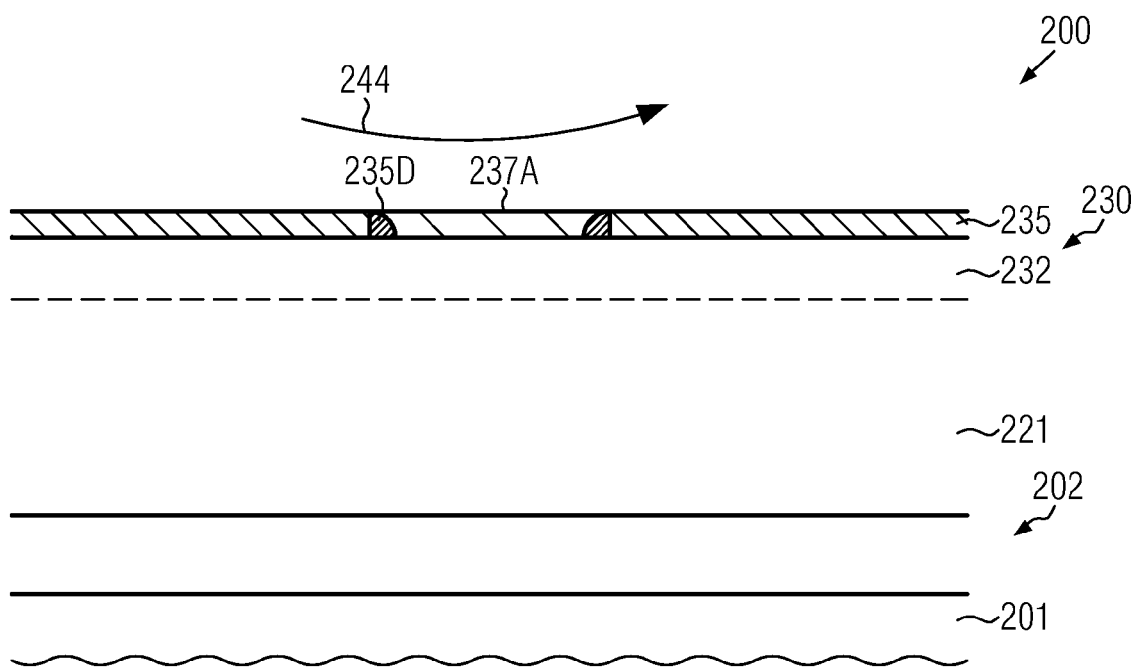

FIG. 2l schematically illustrates the device 200 during a material removal process 244, for instance applied in the form of a chemical mechanical planarization (CMP) process, wherein an excess portion of the material 237 (FIG. 2k) may be removed, while using the layer 234 (FIG. 2k) as an efficient stop layer. Thereafter, the process 244 may be continued so as to remove the layer 234, thereby finally exposing the layer 235 and preserving a portion 237A, the lateral dimension of which is determined by the spacer elements 235D.

Figure 2M:
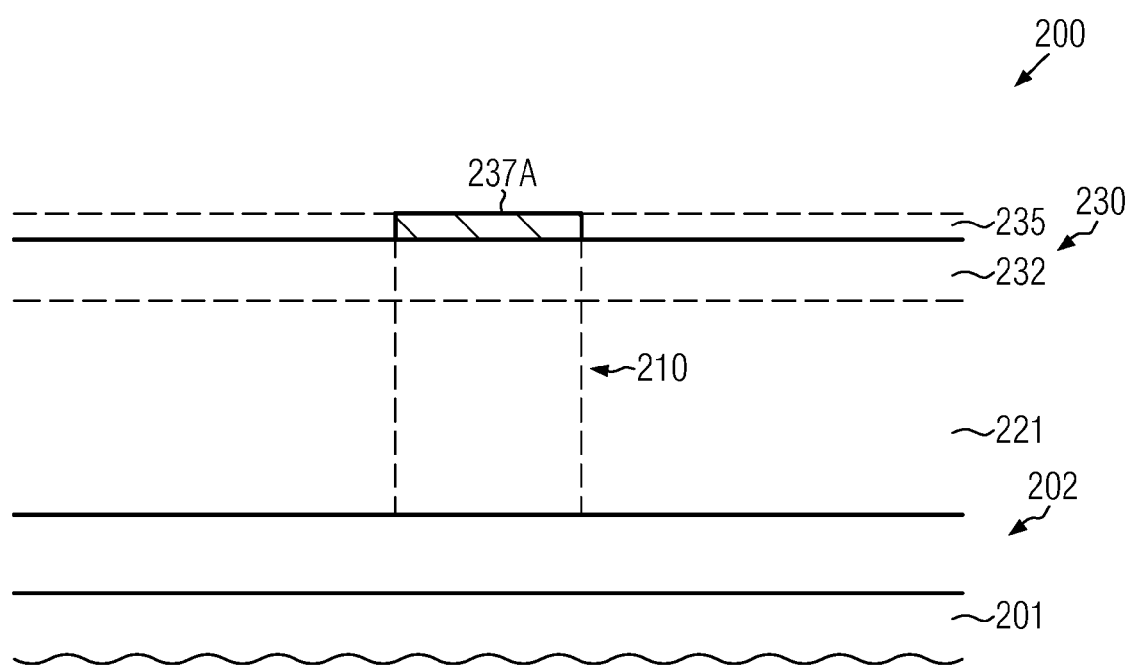

FIG. 2m schematically illustrates the device 200 in a further advanced manufacturing stage in which the layer 235 may be removed selectively with respect to the mask material 237, which may be accomplished on the basis of highly selective wet chemical etch recipes, plasma assisted etch processes and the like. Consequently, the mask feature 237A may have appropriate lateral dimensions as required for patterning the layer 221. To this end, the mask feature 237A may be used for patterning the layer 232, if provided, which in turn may serve as a hard mask material for patterning the remaining portion of the material layer 221. For example, the layer 221 may be patterned into a gate electrode structure 210, the lateral dimensions of which are substantially determined by the mask feature 237A, which in turn may be obtained on the basis of well-established lithography techniques in combination with a selective deposition process.

As a result, the present disclosure enables the formation of sophisticated etch masks by adjusting a mask opening on the basis of a highly controllable selective deposition process so that the desired critical dimensions may be adjusted in the etch mask itself, thereby avoiding the necessity of implementing additional patterning steps upon actually etching the material layer under consideration.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming an etch mask above a semiconductor device, the method comprising:
    forming an opening in a mask layer formed above at least one further mask layer and a material layer to be patterned, said opening extending through said mask layer and exposing a surface of a first layer formed below said mask layer;
    performing a selective deposition process by initiating selective growth of material on an exposed sidewall surface of said mask layer so as to reduce a width of said opening from a first width to a second width while maintaining exposure of at least a portion of said previously exposed surface of said first layer, wherein during said selective deposition process said material is formed only on said exposed sidewall surface of said mask layer and not on an upper surface of said mask layer; and
    patterning said at least one further mask layer by using said opening having said reduced width.

2. The method of claim 1, wherein forming said opening comprises forming a resist mask above said mask layer and using said resist mask as an etch mask when etching through said mask layer.

3. The method of claim 2, wherein said resist mask is formed on said mask layer.

4. The method of claim 2, wherein not forming said material on said upper surface of said mask layer comprises maintaining said resist mask above said mask layer.

5. The method of claim 1, wherein patterning said at least one further mask layer comprises forming a tapered opening in at least one of said at least one further mask layer.

6. The method of claim 1, further comprising forming a resist mask and at least one further mask layer above said mask layer and patterning said at least one further mask layer by using said resist mask.

7. The method of claim 1, wherein performing a selective deposition process comprises establishing a gaseous atmosphere.

8. The method of claim 1, wherein performing a selective deposition process comprises performing a wet chemical deposition process.

9. The method of claim 1, further comprising forming an initialization layer at least on said exposed surface after forming said mask layer and using said initialization layer for initiating said selective growth.

10. The method of claim 1, wherein said reduced width is adjusted to 100 nm or less.

11. The method of claim 1, wherein not forming said material on said upper surface of said mask layer comprises performing a surface treatment on said exposed sidewall surface of said mask layer prior to initiating said selective growth of said material on said exposed sidewall surface.

12. A method, comprising:
    providing a material layer above a substrate of a semiconductor device;
    forming a mask layer stack above said material layer, said mask layer stack comprising a first mask layer and a second mask layer formed above said first mask layer;
    forming a first mask opening in said first mask layer by using a second mask opening formed in said second mask layer;
    reducing a width of said first mask opening by performing a selective deposition process and using an exposed sidewall surface of said first mask layer to initiate said selective deposition process, wherein during said selective deposition process said material is formed only on said exposed sidewall surface of said first mask layer and not on an upper surface of said first mask layer; and patterning said material layer by using said first mask opening having said reduced width as an etch mask.

13. The method of claim 12, wherein patterning said material layer comprises etching into said material layer in the presence of said first mask layer.

14. The method of claim 12, wherein said second mask layer is provided as a radiation sensitive material and is formed on said first mask layer.

15. The method of claim 12, further comprising forming at least one further mask layer between said first mask layer and said second mask layer.

16. The method of claim 12, wherein patterning said material layer comprises forming one of a contact opening and a via opening in said material layer.

17. The method of claim 12, wherein providing said material layer comprises providing a semiconductor layer above said substrate.

18. The method of claim 12, wherein said selective deposition process is performed in the presence of said second mask layer.

19. The method of claim 12, wherein not forming said material on said upper surface of said first mask layer comprises maintaining said second mask layer above said first mask layer.

20. The method of claim 12, wherein not forming said material on said upper surface of said first mask layer comprises performing a surface treatment on said exposed sidewall surface of said first mask layer prior to performing said selective deposition process.

21. A method, comprising:
forming a mask layer above a material layer to be patterned, said material layer being formed above a substrate of a semiconductor device;
forming a resist mask above said mask layer, said resist mask comprising a resist opening;
forming a mask opening in said mask layer through said resist opening, said mask opening exposing a sidewall surface of said mask layer;
growing a material selectively on said exposed sidewall surface in said mask opening to reduce a width of said mask opening while maintaining said resist mask above said mask layer; and
patterning said material layer on the basis of said mask opening having said reduced width.

22. A method, comprising:
forming a mask layer above a material layer to be patterned, said material layer being formed above a substrate of a semiconductor device;
forming a resist mask above said mask layer, said resist mask comprising a resist opening;
forming a mask opening in said mask layer through said resist opening, said mask opening exposing a sidewall surface of said mask layer;
growing a material selectively on said exposed sidewall surface in said mask opening to reduce a width of said mask opening without forming said material on an upper surface of said mask layer; and
patterning said material layer on the basis of said mask opening having said reduced width, wherein patterning said material layer on the basis of said mask opening having said reduced width comprises patterning at least one further mask layer by using said first mask layer and etching into said material layer by using at least said at least one further mask layer as an etch mask.

23. The method of claim 22, wherein not forming said material on said upper surface of said mask layer comprises performing a surface treatment on said exposed sidewall surface of said mask layer prior to growing said material selectively on said exposed sidewall surface.

24. A method, comprising:
forming a mask layer above a material layer to be patterned, said material layer being formed above a substrate of a semiconductor device;
forming a resist mask above said mask layer, said resist mask comprising a resist opening;
forming a mask opening in said mask layer through said resist opening, said mask opening exposing a sidewall surface of said mask layer;
growing a material selectively on said exposed sidewall surface in said mask opening to reduce a width of said mask opening while preventing said material from being formed on an upper surface of said mask layer; and
patterning said material layer on the basis of said mask opening having said reduced width, wherein patterning said material layer comprises forming an opening in said material layer so as to extend to one of a contact region of a semiconductor-based circuit feature and a metal region of a metallization system of said semiconductor device.

25. The method of claim 24, wherein preventing said material from being formed on said upper surface of said mask layer comprises maintaining said resist mask above said mask layer.

* * * * *